United States Patent
Kirlin

[11] Patent Number: 6,072,689
[45] Date of Patent: Jun. 6, 2000

[54] FERROELECTRIC CAPACITOR AND INTEGRATED CIRCUIT DEVICE COMPRISING SAME

[75] Inventor: Peter S. Kirlin, Newtown, Conn.

[73] Assignee: Advanced Technology Materials, Inc., Danbury, Conn.

[21] Appl. No.: 09/256,456

[22] Filed: Feb. 23, 1999

Related U.S. Application Data

[62] Division of application No. 08/974,779, Nov. 20, 1997.

[51] Int. Cl.[7] ........................... H01G 4/008; H01G 4/006
[52] U.S. Cl. ..................... 361/311; 361/305; 361/313; 361/321.5
[58] Field of Search .............................. 361/301.1, 301.2, 361/303, 311, 312, 313, 320, 321.1, 321.2, 321.3, 321.4, 321.5; 257/303, 306, 310

[56] References Cited

U.S. PATENT DOCUMENTS

| | | | |
|---|---|---|---|
| 476,274 | 6/1992 | Huck . | |
| 2,490,547 | 12/1949 | Schraner et al. | 219/39 |
| 2,622,184 | 12/1952 | Johneas | 219/38 |
| 2,801,322 | 7/1957 | Wetherill | 219/39 |
| 2,925,329 | 2/1960 | Yost | 23/281 |
| 3,190,262 | 6/1965 | Bakish et al. | 118/48 |
| 3,404,873 | 10/1968 | Orens | 261/141 |
| 3,520,416 | 7/1970 | Keedwell | 210/490 |
| 3,549,412 | 12/1970 | Frey, Jr. et al. | 117/100 |
| 3,659,402 | 5/1972 | Alliger | 55/233 |
| 3,823,926 | 7/1974 | Bracich | 261/106 |
| 3,969,449 | 7/1976 | Shires et al. | 261/153 |
| 4,036,915 | 7/1977 | Lucero et al. | 261/104 |
| 4,080,926 | 3/1978 | Platakis et al. | 118/5 |
| 4,288,396 | 9/1981 | Ottestad | 261/128 |
| 4,529,427 | 7/1985 | French | 65/3.12 |
| 4,799,093 | 1/1989 | Kohara et al. | 357/23.6 |
| 4,833,976 | 5/1989 | Loland | 92/86.5 |
| 4,842,893 | 6/1989 | Yializis et al. | 427/44 |
| 4,847,469 | 7/1989 | Hofmann et al. | 219/273 |
| 4,954,371 | 9/1990 | Yialiis | 427/44 |
| 5,005,102 | 4/1991 | Larson | 361/313 |
| 5,034,372 | 7/1991 | Matsuno et al. | 505/1 |
| 5,097,800 | 3/1992 | Shaw et al. | 118/730 |
| 5,110,622 | 5/1992 | Hasegawa et al. | 427/126.1 |
| 5,120,703 | 6/1992 | Snyder et al. | 505/1 |

(List continued on next page.)

FOREIGN PATENT DOCUMENTS

| | | |
|---|---|---|
| 0 058 571 | 8/1982 | European Pat. Off. . |
| 0 405 634 A2 | 1/1991 | European Pat. Off. . |
| 58-125633 | 7/1983 | Japan . |
| 1305813 | 12/1989 | Japan . |
| WO93/04072 | 3/1993 | WIPO . |

OTHER PUBLICATIONS

"Integrated Systems Approach Based on DLI," Bulletin LPDS—Dec. 1994, copyright 1994, MKS Instruments, Inc. (no month).

"Direct Liquid Injection Sub–System—DLI–25B," Bulletin DLI—Dec. 1994, MKS Instruments, Inc. (no month).

Singh, R.K., "In situ processing of eptiaxial Y–Ba–Cu–O high Tc superconducting films on (100) $SrTiO_3$ and (100) YS–$ZrO_2$ substrates at 500–650° C," App. Phys. Lett. 54(22), May 29, 1989, pp. 2271–2273.

Yoshitake, T., et al., "As–grown superconducting Bi–Sr–Ca–Cu–O thin films by coevaporation," App. Phys. Lett. 55(7), Aug. 14, 1989, pp. 702–704.

(List continued on next page.)

Primary Examiner—Kristine Kincaid
Assistant Examiner—Eric W. Thomas
Attorney, Agent, or Firm—Steven J. Hultquist; Oliver A. Zitzmann

[57] ABSTRACT

An integrated circuit capacitor in which a first conductive plate, a layer of ferroelectric material, and a second conductive plate are deposited and formed in sequence. Thereafter a diffusion barrier material and an insulative material are deposited either as a layered dielectric stack with alternating layers of the diffusion barrier material and the insulative material with tensile and compressive stresses in the alternating layers offsetting one another, or as a graded diffusion barrier material varying from a binary oxide of Ta, Nb, or Zr at the surface of the ferroelectric material to $SiO_2$ at a distance above the surface of the ferroelectric material.

28 Claims, 4 Drawing Sheets

U.S. PATENT DOCUMENTS

| | | |
|---|---|---|
| 5,139,999 | 8/1992 | Gordon et al. .............................. 505/1 |
| 5,165,960 | 11/1992 | Platts ....................................... 427/166 |
| 5,204,314 | 4/1993 | Kirlin et al. . |
| 5,212,620 | 5/1993 | Evans, Jr. et al. ...................... 361/313 |
| 5,225,561 | 7/1993 | Kirlin et al. ........................... 546/256 |
| 5,248,787 | 9/1993 | Timmer et al. ......................... 549/206 |
| 5,259,995 | 11/1993 | Matalis .................................... 261/107 |
| 5,280,012 | 1/1994 | Kirlin et al. .............................. 505/1 |
| 5,350,705 | 9/1994 | Brassington et al. ................... 257/295 |
| 5,376,409 | 12/1994 | Kaloyeros et al. .................. 427/248.1 |
| 5,416,042 | 5/1995 | Beach et al. ............................ 438/396 |
| 5,519,566 | 5/1996 | Perino et al. ........................ 361/321.4 |
| 5,536,323 | 7/1996 | Kirlin et al. . |
| 5,554,564 | 9/1996 | Nishioka et al. ........................ 437/192 |
| 5,563,762 | 10/1996 | Leung et al. .......................... 361/301.4 |
| 5,576,928 | 11/1996 | Summerfelt et al. ................ 361/321.1 |
| 5,696,018 | 12/1997 | Summerfelt et al. .................... 438/396 |
| 5,711,816 | 1/1998 | Kirlin et al. ............................ 118/726 |
| 5,753,975 | 5/1998 | Matsuno .................................. 257/751 |
| 5,780,351 | 7/1998 | Arita et al .............................. 438/396 |
| 5,892,254 | 4/1999 | Park et al. .............................. 257/295 |
| 5,923,970 | 7/1999 | Kirlin ...................................... 438/240 |

OTHER PUBLICATIONS

Erbil, A., et al., "A Review of Metalorganic Chemical Vapor Deposition of High–Temperature Superconducting Thin Films," SPIE vol. 1187 Processing of Films for High Tc Superconducting Electronics (1989), 104–109. (no month).

Kirlin, Peter S., et al., "Growth of high Tc YBaCuO thin films by metalorganic chemical vapor deposition," SPIE vol. 1187 Processing of Films for High Tc Superconducting Electronics (1989), 115–127. (no month).

Zama, H., et al., "Properties of Metalorganic Precursors for Chemical Vapor Deposition of Oxide Superconductors," Japanese Journal of Applied Physics, 29(7), Jul. 1990, pp. L1072–L1074.

Gardiner, R., et al., "Volatile Barium β–Diketonate Polyether Adducts. Synthesis, Characterization, and Metallorganic Chemical Vapor Deposition," Chem. Mater., 3(6), 1991, pp. 1053–1059. (No month).

Lackey, W.J., et al., "Rapid chemical vapor deposition of superconducting $YBa_2Cu_3O_x$," Appl. Phys. Lett. 56(12), Mar. 19, 1990, pp. 1175–11177.

Turnipseed, S.B., et al., "Synthesis and Characterization of Alkaline–Earch–Metal β–Diketonate Complexes Used as Precursors for Chemical Vapor Deposition of Thin–Film Superconductors," Inorg. Chem. 1991, 30(6), 1164–1170. (no month).

Hiskes, R., et al., "Single source metalorganic chemical vapor deposition of flow microwave surface resistance $YBa_2Cu_3O_7$," Appl. Phys. Lett. 59(5), Jul. 29, 1991, pp. 606–607.

Zhang, J., et al., "Plasma Enhanced Metalorganic Chemical Vapor Deposition of Conductive Oxide Electrodes for Ferroelectric $BaTiO_3$ Capacitors," Mat. Res. Soc. Symp. Proc., vol. 310, 1993, pp. 249–254. (no month).

Van Buskirk, P., et al., "MOCVD Growth of $BaTiO_3$ in an 8" Single–Wafer CVD Reactor," Proceedings of ISAF92, in press (1992), 3 pages. (no month).

Zhang, J., et al., "Single liquid source plasma–enhanced metalorganic chemical vapor deposition of high–quality $YBa_2Cu_3O_{7-x}$ thin films," Appl. Phys. Lett. 61(24), Dec. 14, 1992, pp. 2884–2886.

Panson, A.J., et al., "Chemical vapor deposition of $YBa_2Cu_3O_7$ using metalorganic chelate precursors," Appl. Phys. Lett. 53(18), Oct. 31, 1988, pp. 1756–1757.

Scarsbrook, G., et al., "Low temperature pulsed plasma deposition. Part I—a new technique for thin film deposition with complete gas dissociation," Vacuum, 38(3–10), 1988, pp. 627–631. no month.

FERROELECTRIC CAPACITOR AND INTEGRATED CIRCUIT DEVICE COMPRISING SAME

This application is a division of application Ser. No. 08/974,779, filed Nov. 20, 1997, which is incorporated herein by reference.

BACKGROUND OF THE INVENTION

1. Field of the Invention

This invention relates to devices methods for fabricating integrated circuits and more particularly to a method for fabricating a ferroelectric capacitor in an integrated circuit (IC) device, as well as the ferroelectric capacitor structure and the IC device comprising same.

2. Description of the Related Art

Integrated circuit chips include a substrate of semiconductive material with component structures of electronic circuits, e.g., transistors and resistors, fabricated within the substrate structure. Additional electrical devices and precursor and/or component structures of the electronic circuits are fabricated over the top of the substrate. These additional devices and structures of circuits include conductive leads, capacitors, and parts of transistors. The devices fabricated above the substrate typically require many layers, of a variety of materials, e.g., conductors, semiconductors, insulators, and barriers.

Conductive layers in integrated circuit devices often are fabricated in aluminum (Al), copper (Cu) or tungsten (W). Each conductive layer is deposited over an underlying surface and typically is patterned and etched into a shape that is predetermined by designers to perform a desired function in the final circuit product. Typical integrated circuit devices require multiple layers of conductive materials. Undesirable electrical shorting between conductive layers is prevented by interposing one or more layers of insulative material between each conductive layer and the next conductive layer above and/or below it.

Fabrication of an integrated circuit capacitor requires the fabrication of two layers of conductive materials forming the conductive plates of the capacitor. Those two plates are separated by a layer of dielectric material. During recent years researchers and designers have been investigating the use of high dielectric constant materials for use as integrated circuit capacitor dielectrics. Some promising high dielectric constant materials include lead zirconium titanate ($PbZrTiO_3$), sometimes hereinafter denoted "PZT," and strontium bismuth tantalum oxide ($SrBi_2Ta_2O_9$), sometimes hereinafter denoted "SBT." Because of the hysteresis type voltage-current (VI) characteristics of these materials, they are known as ferroelectric materials.

During fabrication of integrated circuit devices including capacitors with a ferroelectric dielectric material, the ferroelectric material is deposited before the second, or upper, plate of the capacitor is deposited and formed. After the upper plate is formed, a layer of insulative material typically is deposited to insulate the upper plate from another layer of conductive material, generally referred to as a metal layer. The process of shaping the upper plate of the capacitor can expose a portion of the ferroelectric material before the insulative material is to be deposited.

A standard insulative material, long used in fabrication of integrated circuit devices, is silicon dioxide ($SiO_2$). Because developers have lengthy experience working with silicon dioxide and appropriate equipment for depositing it, silicon dioxide is the insulative material of choice for the layer of intermetal insulator between the upper capacitor plate and the next overlying conductive layer.

Silicon dioxide appears to be a very good choice as the intermetal layer material except that in combination with the ferroelectric material, it creates problems while it is being deposited or during subsequent processing steps. A primary problem is that silicon dioxide reacts directly with the exposed parts of $PbZrTiO_3$ or $SrBi_2Ta_2O_9$ while the silicon dioxide is being deposited or during the subsequent processing steps. This reaction degrades the electrical properties of the ferroelectric material. Chemical vapor deposition (CVD) is a process used for depositing the silicon dioxide. The CVD process uses either hydrogen or silicon hydride ($SiH_4$), as a carrier gas. Both of these carrier gas species are reducing gases. These reducing gases can react directly with the ferromaterial to form water which in turn reacts with the ferroelectric material and degrades its electrical properties.

Additionally, the deposited layer of silicon dioxide has a residual compressive stress in its crystalline structure. This compressive stress is translated into the ferroelectric material and degrades the electrical properties of the ferroelectric material.

Developers are left with a dilemma of finding a different material than silicon dioxide for use as an intermetal insulator or of finding a new device structure and a new method for depositing silicon dioxide without degrading the desirable electrical characteristics of the ferroelectric material, used as a capacitor dielectric.

SUMMARY OF THE INVENTION

The foregoing and other problems are resolved by a new device structure and a method of fabricating an integrated circuit capacitor. A first conductive plate is deposited and formed on a substrate. A layer of ferroelectric material is deposited and formed over the first conductive plate, and a second conductive plate is deposited and formed on the layer of ferroelectric material. A layer of a diffusion barrier material and a layer of an insulative material are deposited over the second conductive plate, wherein residual tensile stress in the crystalline structure of the diffusion barrier material offsets residual compressive stress in the crystalline structure of the insulative material.

Materials, such as $PbZrTiO_3$ or $SrBi_2Ta_2O_9$, may be used as the ferroelectric material.

Materials, such as $TiO_2$, $ZrO_2$, $Ta_2O_5$, $Nb_2O_5$, and $Zr_{1-x}Ti_xO_2$, where x is a number in a range from zero to one, may be used as the diffusion barrier material.

Materials, such as $SiO_2$, $Si_3N_4$, spin-on-glass, $SiF_zO_{4-z}$, wherein z is a number that varies in a range from zero to four, or an organic dielectric, such as polyimide, and compatible combinations of the foregoing, may be used as the insulative material.

In an alternative method, the diffusion barrier material and the insulative material may be deposited as a layered dielectric stack with alternating layers of the diffusion barrier material and the insulative material. Residual tensile stresses in the layers of diffusion barrier material offset the residual compressive stresses in the layers of insulative material.

In another method of the present invention, a graded diffusion barrier material is deposited on the top capacitor plate and the exposed ferroelectric material. The graded diffusion barrier material may suitably comprise $Ta_{5-y}Si_yO_{10}$ or $Nb_{5-y}Si_yO_{10}$ with y being a number varying along the thickness of the barrier material, e.g., from zero at the second conductive plate to five at a desired distance from the second conductive plate.

In still another method aspect of the invention, a graded diffusion barrier material of the formula $Zr_{1-x}Si_xO_2$ is deposited on the ferroelectric material, wherein x is a number varying along the thickness of the diffusion barrier material, from zero at the second conductive plate to one at a desired distance from the second conductive plate.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
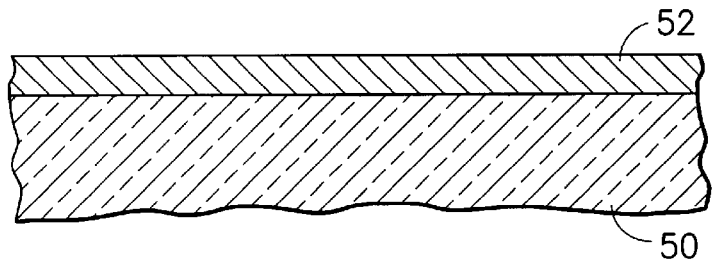
FIG. 1 is a cross-sectional view of a substrate with a layer of conductive material deposited thereupon.

Referring now to FIG. 1, there is shown a semiconductor substrate 50 that has a conductive layer of material 52 deposited thereupon. This layer of conductive material 52 may be any compatible conductor, such as a metal. Typical metallic conductors include aluminum (Al), copper (Cu) and tungsten (W). The metallic conductor may be suitably deposited by a chemical vapor deposition (CVD) process, using well-known apparatus and processing parameters. After the layer of conductive material 52 is deposited on the substrate 50, then the conductive material is formed into a desired shape of a capacitor plate by conventional techniques well-known in the art.

Figure 2:
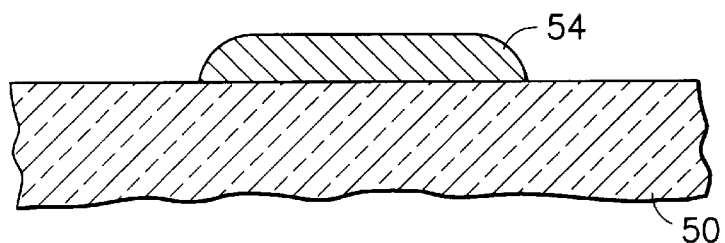
FIG. 2 is a cross-sectional view of the part of FIG. 1 with the conductive material formed into a first capacitor plate.

FIG. 2 shows the result of the steps of processing the device, as shown in FIG. 1, to form the first plate 54 of a capacitor that may be used as the storage capacitor in an integrated circuit memory device. In the process steps, a photoresist is deposited over the layer of conductive material 52 of FIG. 1. The photoresist is patterned, and the layer of conductive material 52 is etched away, by a suitable conventional etch technique, except for the shape of the capacitor plate 54. This capacitor plate 54 thus forms the first, or bottom, plate of the storage capacitor being fabricated.

Figure 3:
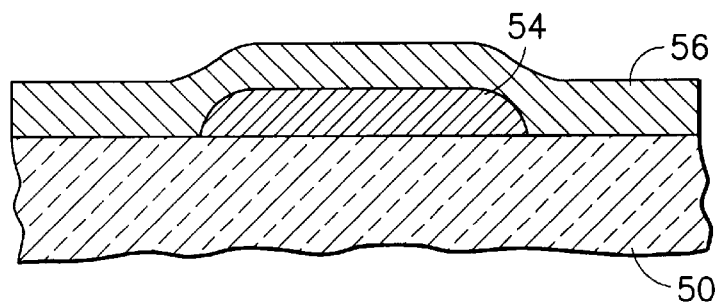
FIG. 3 is a cross-sectional view of the part of FIG. 2 with a layer of ferroelectric material deposited over the first capacitor plate.

As shown in FIG. 3, a layer of insulative material 56 is deposited over the first capacitor plate 54 and any exposed surfaces of the substrate 50. The insulative material 56 is selected to be a high dielectric material with ferroelectric characteristics. Examples of such ferroelectric materials include materials such as lead zirconium titanate ($PbZrTiO_3$) and strontium bismuth tantalum oxide ($SrBi_2Ta_2O_9$). Either of these ferroelectric materials can be deposited by a chemical vapor deposition process using known apparatus and processing parameters. After the insulative layer 56 is deposited, it is shaped to conform with the designer's desired capacitor dielectric shape.

Figure 4:
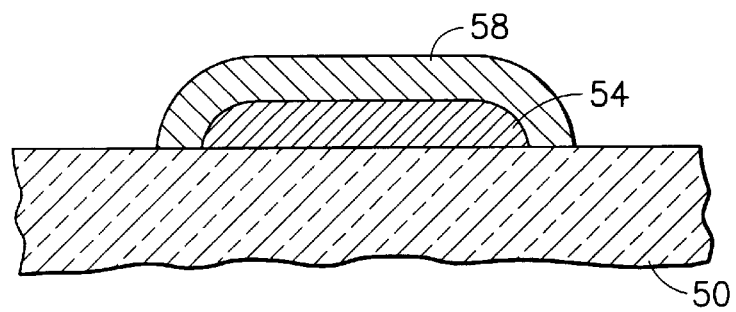
FIG. 4 is a cross-sectional view of the part of FIG. 3 after the ferroelectric material is formed into shape as the capacitor dielectric.

Referring now to FIG. 4, there is shown the result of shaping the ferroelectric material 56 of FIG. 3 into the capacitor dielectric layer 58. This shaping is accomplished by depositing a photoresist material over the layer of ferroelectric material, patterning the photoresist, and etching away undesired ferroelectric material. The etching may be readily accomplished by use of a conventional dry etch process. As a result, the device being fabricated now includes the substrate 50, the first capacitor plate 54, and the capacitor dielectric 58 which is made of either $PbZrTiO_3$ or $SrBi_2Ta_2O_9$.

Figure 5:
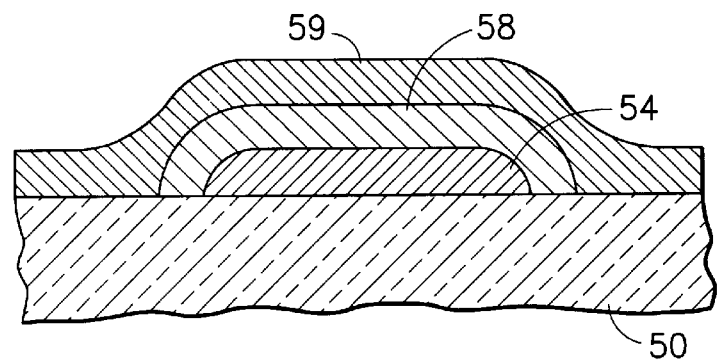
FIG. 5 is cross-sectional view of the part of FIG. 4 with a second layer of conductive material deposited over the shaped ferroelectric material.

FIG. 5 shows the cross-section of the device following deposition of another layer of conductive material 59, which is deposited over the capacitor dielectric 58. Typically a metal, e.g., aluminum or tungsten, is used. For ease of fabrication, the choice of metal for this layer may be the same material as the metal selected for use in the first capacitor plate 54. The selected metal can be deposited by chemical vapor deposition (CVD) using known apparatus and processing parameters. After this conductive layer is deposited, it is shaped into a second capacitor plate.

Figure 6:
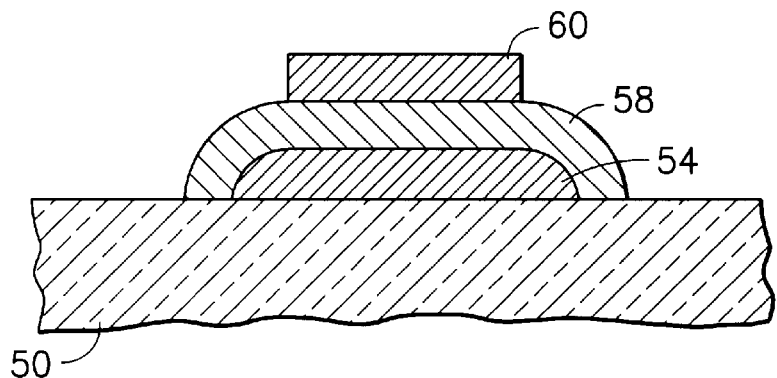
FIG. 6 is cross-sectional view of the part of FIG. 5 after the second layer of conductive material is shaped into a second capacitor plate.

Referring now to FIG. 6, there is shown the result of the device with the conductive layer 59 of FIG. 5 shaped into a second, or upper, capacitor plate 60 of the desired capacitor structure. The shaping occurs by depositing a photoresist material over the conductive layer 58 of FIG. 5, patterning the photoresist, and etching away undesired portions of the conductive layer 58. The etch removal of undesired portions of the conductive layer 58 may be effected with any suitable conventional etching process having utility for such purpose. Thus the second capacitor plate 60 is left on top of the capacitor dielectric layer 58. It is noted that the desired shape of the second capacitor plate 60 leaves end portions of the capacitor dielectric layer 58 exposed to deposition of a subsequent layer of material. Although such exposure of the dielectric material 58 may not occur in all capacitor designs, it does occur in some highly desirable capacitor designs. Selection of appropriate subsequent processing steps is important to avoid depositing an intermetal insulator, such as silicon dioxide ($SiO_2$), which would degrade the electrical properties of the capacitor dielectric 58.

In accordance with the present invention, a new structural arrangement is used and a new step is employed in the fabrication process to prevent degradation of the capacitor dielectric 58 during subsequent processing. This step comprises the deposition of an oxygen diffusion barrier layer that prevents oxygen from diffusing from the capacitor dielectric 58 to the intermetal dielectric layer which is to be subsequently deposited. The barrier layer also prevents diffusion of hydrogen and water from the atmosphere of the deposition vessel (not shown) to the capacitor dielectric layer 58 during the fabrication process.

Figure 7:
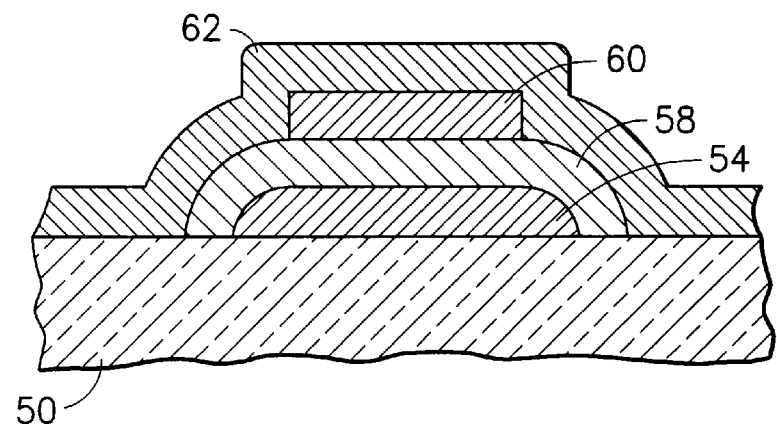
FIG. 7 is cross-sectional view of the part of FIG. 6 with a layer of diffusion barrier material deposited over the second capacitor plate.

In FIG. 7, the device being fabricated is now shown with a layer of oxygen diffusion barrier material 62 deposited over the top of the second capacitor plate 60 and the exposed portions of the capacitor dielectric 58. Binary oxides, e.g., titanium oxide ($TiO_2$), zirconium oxide ($ZrO_2$), tantalum oxide ($Ta_2O_5$), and niobium oxide ($Nb_2O_5$) may be used to form the oxygen diffusion barrier layer 62. Deposition can be accomplished by physical vapor deposition (PVD), sputtering, or evaporation, at appropriate and readily determinable process conditions therefor.

The resulting layer of oxygen diffusion barrier material 62 provides a dense, hydrogen ($H_2$) free and water ($H_2O$) free barrier for the device being fabricated.

This diffusion barrier 62 prevents reduction of the capacitor dielectric, or ferroelectric, layer 58. Degradation of the electrical characteristics of the ferroelectric material is thereby avoided.

Advantages of the PVD process for the formation of the diffusion barrier include the fact that the process can be adjusted to be dry, i.e. no water, and oxidizing. The diffusion barrier 62 can be deposited with a residual tensile stress in its crystalline structure.

The formation of the diffusion barrier with residual tensile stress may be achieved by techniques known in the art, such as described in G. H. Haertling, *Ferroelectrics*, 1987, Vol. 75, pp. 25–55 (III. Properties, 2. Mechanical Properties, $2^{nd}$ paragraph), where in discussing the highly compliant nature of PLZT (Pb—La—Zr—Ti—O), Haertling mentions a device disclosed in turn in J. Maldonado and A. Meitzler, *Proc. IEEE,* 1971, Vol. 59, p. 368 in which "domain orientation was accomplished by mechanically flexing a PLZT plate bonded to a plexiglas substrate." Such mechanical flexure approach can be employed to provide the diffusion barrier 62 with an appropriate residual tensile stress to counteract the residual compressive stresses in the layer(s) of insulative material subsequently deposited over the barrier layer.

Alternatively, the diffusion barrier may be formed with phase changes during processing whereby residual tensile stresses are imparted to the product diffusion barrier film.

Additionally, differential temperature effects may be employed in the formation of the barrier layer to impart residual tensile stresses to the barrier layer film.

Figure 8:
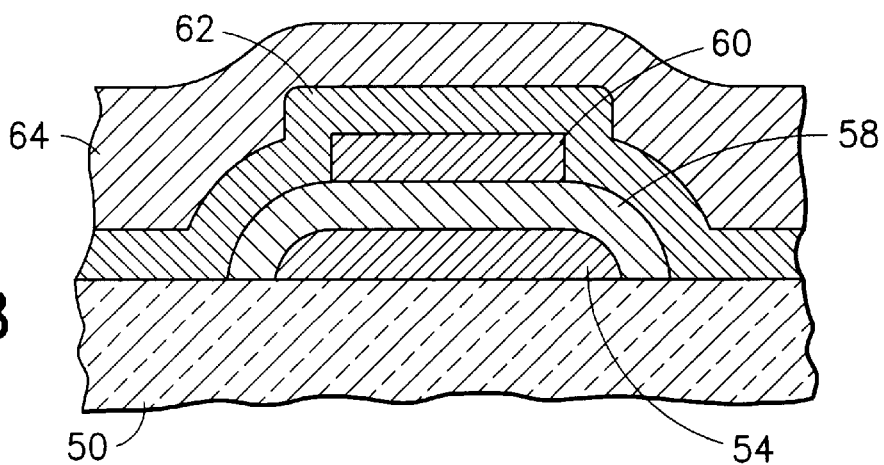
FIG. 8 cross-sectional view of the part of FIG. 7 with an intermetal level dielectric deposited over the diffusion barrier layer.

Referring now to FIG. 8, there is shown a cross-section of the integrated circuit device after deposition of a layer of intermetal dielectric 64. Because of the advantageous oxygen diffusion barrier layer 62, materials such as silicon dioxide ($SiO_2$) which would otherwise be unsuitable, can be deposited as the intermetal dielectric layer, without causing undesirable degradation of the electrical characteristics of the capacitor dielectric layer 58. This layer of silicon dioxide, as an intermetal dielectric, can he deposited by a CVD step. Such a process advantageously provides desirable conformality, or smoothing of the resulting top surface in preparation for subsequent fabrication processing steps.

There are various other alternative materials which also can be used in the formation of the intermetal dielectric. Illustrative of such alternative materials are silicon nitride ($Si_3N_4$), spin-on-glass, silicon fluoride ($SiF_yO_{4-y}$) where y is a number in a range from zero to four, or an organic dielectric, such as polyimide. Spin on dielectrics are inherently planarizing with respect to subsequent fabrication processing steps.

Inherent residual compressive stress in the intermetal dielectric layer 64 is offset either in part or wholly by the residual tensile stress in the crystalline structure of the oxygen diffusion barrier layer 62.

The present invention therefore provides a new device structure and a sequence of processing steps that resolve the dilemma concerning how to take advantage of the favorable qualities of a ferroelectric capacitor dielectric without degrading the electrical characteristics of that ferroelectric material when intermetal dielectric materials such as silicon dioxide are deposited adjacent to the ferroelectric material. There are alternative resolutions to that dilemma.

One alternative is to use a fabrication process of steps represented by FIGS. 1–6, as previously described. It is noted that the bottom and top capacitor plates 54 and 60 together with the capacitor dielectric layer 58 are all deposited and formed into a capacitor, as shown in FIG. 6. Portions of the capacitor dielectric 58 are exposed to material that will be subsequently deposited.

Figure 9:
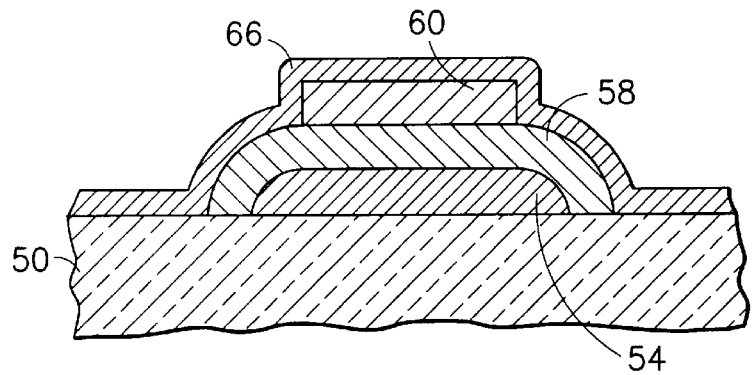
FIG. 9 is a cross-sectional view of the part of FIG. 6 with a first layer of diffusion barrier material deposited, as the first of a stack of layered dielectric materials, over the second capacitor plate.

Referring now to FIG. 9, there is shown the result from the next processing step in an alternative processing sequence. A thin layer 66 of oxygen diffusion barrier material is deposited by chemical vapor deposition over the second capacitor plate 60 and the capacitor dielectric 58. This thin layer 66 of diffusion barrier material is the first layer of a multi-layered dielectric stack of diffusion barrier material and insulator. The diffusion barrier material can be selected from the previously mentioned group of diffusion barrier materials for the process of FIGS. 1–8.

Figure 10:
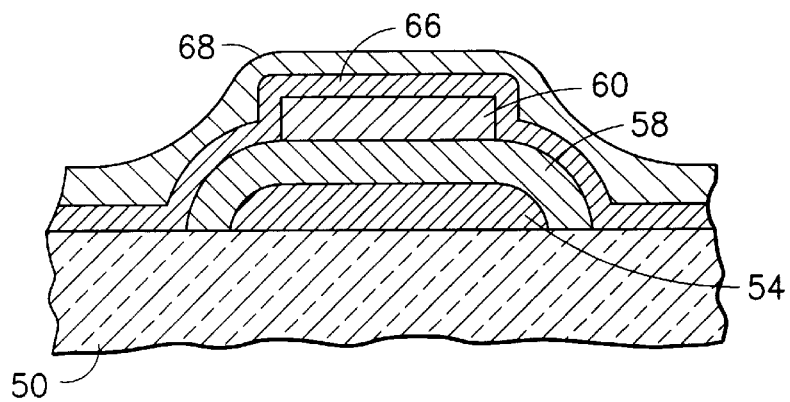
FIG. 10 is a cross-sectional view of the part of FIG. 9 with a first layer of insulative material deposited, as a second of the stack of layered dielectric materials, over the second capacitor plate.

FIG. 10 shows the result of the next processing step. A thin layer 68 of insulator material, such as silicon dioxide ($SiO_2$), is deposited by physical vapor deposition over the thin layer 66 of diffusion barrier material. The thin layer of insulator may be formed of a material selected from the group of alternative insulator materials previously mentioned. This layer of insulator material forms the second layer of the stack of layers.

Figure 11:
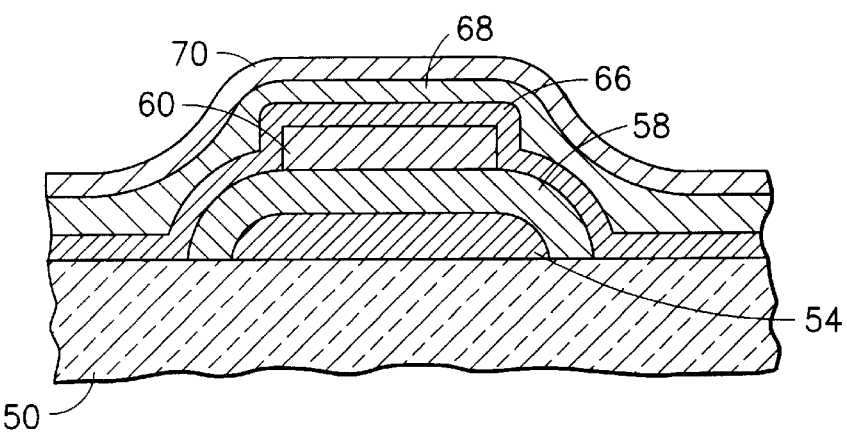
FIG. 11 is a cross-sectional view of the part of FIG. 10 with a second layer of diffusion material in the stack.

In FIG. 11 there is shown the result of the next step of the alternative processing sequence. Another thin layer 70 of the selected oxygen diffusion barrier material is deposited by chemical vapor deposition over the layer of insulator 68. This layer of diffusion barrier material forms the third layer of the stack of layers.

Figure 12:
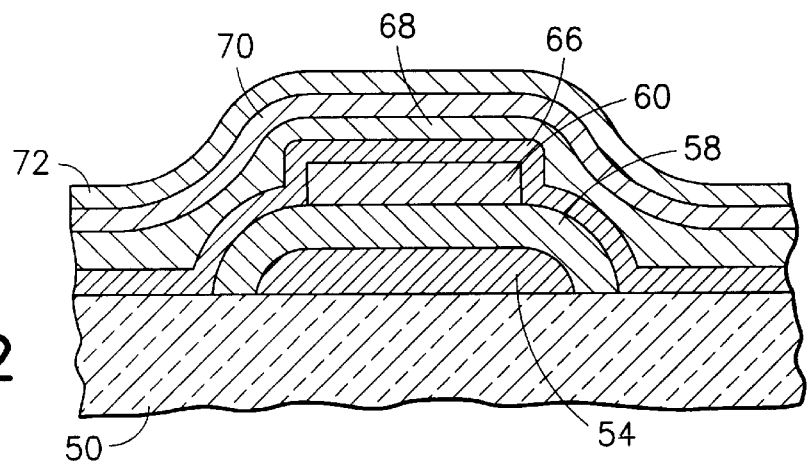
FIG. 12 is a cross-sectional view of the part of FIG. 11 with a second layer of insulative material in the stack.

FIG. 12 shows the result of deposition by physical vapor deposition of another thin layer 72 of the selected insulator material over the thin layer 70 of diffusion barrier material.

This layer of insulator forms the fourth layer of the stack of layers. Additional layers of barrier material and insulator can he used as desired.

Other previously mentioned alternative processing choices for depositing either the barrier layers or the insulator layers are also appropriate choices for the just described multi-layered dielectric stack of diffusion barrier material and insulator.

The alternate layers of diffusion barrier material and insulator have residual tensile stresses and compressive stresses, respectively. By careful design of thicknesses of the layers and the selected parameters for deposition, the tensile and compressive stresses in the respective alternating sequential layers can be made to cancel one another out, so that the net stress is zero or close to zero.

Although depositing the multi-layers of barrier material and insulator may appear to be time consuming and expensive, both processing time and expense can be limited by using a multi-station deposition tool, such as, for example, a Novellus Concept 1 or 2 reactor. In that reactor, the barrier layer material can be deposited in the first station of the reactor and the insulator in the second station in successive deposition steps.

Another advantageous alternative processing sequence which resolves the dilemma of how to process a device successfully with both the ferroelectric material and the silicon dioxide insulator is now described. In this second alternative process, the device proceeds through the sequence of steps represented by FIGS. 1–6, as previously described, to thereby fabricate the first and second capacitor plates 54 and 60 and the capacitor dielectric 58.

Figure 13:
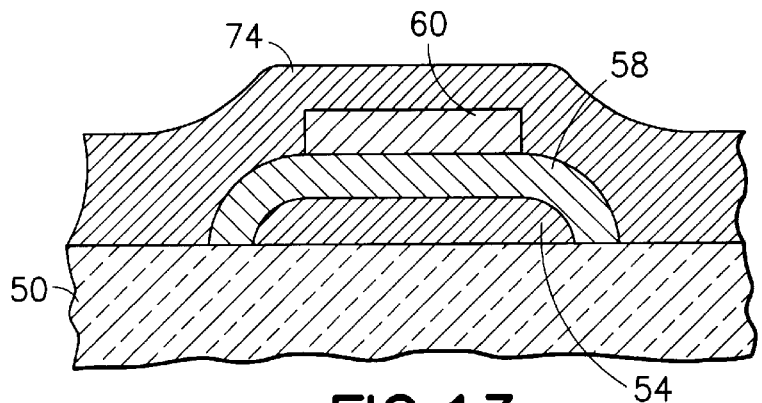
FIG. 13 is a cross-sectional view of the part of FIG. 6 with a layer of graded diffusion barrier material deposited over the second capacitor plate.

Referring now to FIG. 13, there is shown the result of the next step in the second alternative process. A graded barrier layer 74 is deposited by CVD over the second capacitor plate 60 and the capacitor dielectric 58. The deposition starts with a deposit of pure oxygen diffusion barrier material, e.g., $Ti_{1-x}Si_xO_2$ with the number x=0. Gradually the composition of the deposition material is varied to increase the value of the number x toward one. When the number x=1, the process is stopped. The deposited material then is silicon dioxide which becomes the top surface of the graded barrier layer. This second alternative processing sequence is best practiced using binary oxides having continuous solubility in one another, e.g., titanium dioxide and silicon dioxide.

Figure 14:
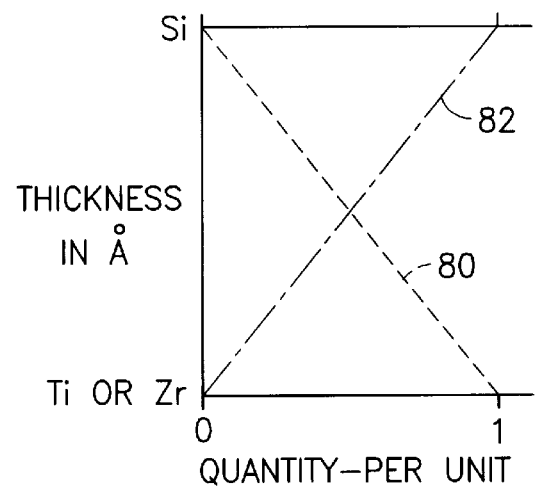
FIGS. 14 and 15 are graphs showing the relationships between selected materials that may be utilized the graded diffusion barrier layer of FIG. 13.

FIG. 14 presents a graph that shows the relationships between the quantity of silicon (Si) and either titanium (Ti) or zirconium (Zr) in the graded barrier layer 74 of FIG. 13. Quantity of the elements silicon and titanium in the material $Ti_{1-x}Si_xO_2$ per molar unit of the oxide material is determined on the horizontal axis. Thickness of the graded barrier layer is shown on the vertical axis. The quantity of titanium is represented by the line 80 and goes to zero at the top surface of the layer. The quantity of silicon is represented by the line 82 and goes to zero at the bottom of the layer, i.e., at the surface of the ferroelectric material. The material $Zr_{1-x}Si_xO_2$ is presented similarly in the graph of FIG. 14 where the line 80 represents the quantity of zirconium.

Figure 15:
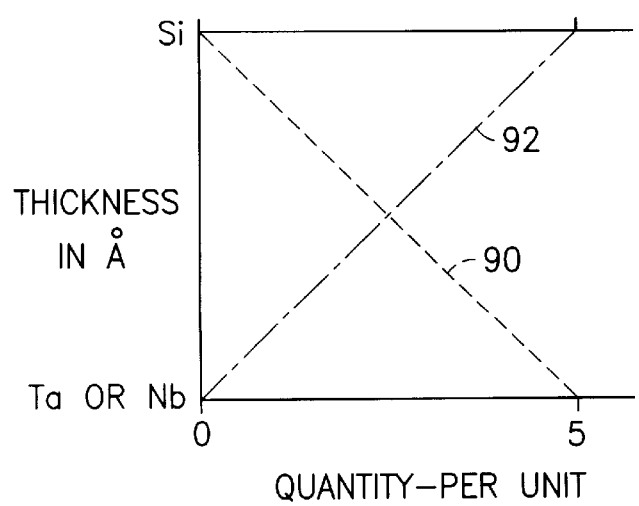

Referring now to FIG. 15, there is a graph showing the quantities of silicon and tantalum or niobium in graded barrier layers of either $Ta_{5-y}Si_yO_{10}$ or $Nb_{5-y}Si_yO_{10}$, where y is a number in a range from zero to five. The graph is similar to the graph of FIG. 14 except that line 90 represents the quantity of tantalum or niobium and the line 92 represents the quantity of silicon.

The foregoing describes device structures and methods for processing integrated circuit devices including ferroelectric materials and reducing insulator materials, which avoid adverse degradation of the electrical characteristics of the ferroelectric material.

Accordingly, while the invention has been illustratively described herein with reference to specific aspects, features and embodiments thereof, it will be appreciated that the invention is not thus limited, and therefore is susceptible of other variations, modifications and other embodiments, and all such variations, modifications, and other embodiments are therefore intended to be encompassed within the spirit and scope of the claims hereafter set forth.

What is claimed is:

1. An integrated circuit device comprising:
    a substrate;
    a first capacitor plate formed on the substrate;
    a layer of ferroelectric material formed on the first capacitor plate;
    a second capacitor plate formed over part of the ferroelectric material; and
    a graded diffusion barrier material deposited over the second capacitor plate and an exposed part of the ferroelectric material.

2. The device of claim 1 wherein:
    the ferroelectric material comprises a material selected from the group consisting of $PbZrTiO_3$ and $SrBi_2Ta_2O_9$.

3. The device of claim 1 wherein:
    the diffusion barrier layer material comprises a material selected from the group consisting of $TiO_2$, $ZrO_2$, $Ta_2O_5$, $Nb_2O_5$, $Zr_{1-x}Ti_xO_2$, where x is a number in a range from zero to one, and $Ta_{5-y}Si_yO_{10}$, where y is a number in a range from zero to five.

4. The device of claim 1 wherein:
    the insulative layer material comprises $SiO_2$.

5. The device of claim 1, further comprising an insulative material deposited over the diffusion barrier material, wherein:
    the insulative layer material comprises a material selected from the group consisting of $Si_3N_4$, spin-on-glass, $SiF_zO_{4-z}$, and organic dielectric materials, where z is a number in a range from zero to four.

6. The device of claim 1, further comprising an insulative material deposited over the diffusion barrier material, wherein:
    the diffusion barrier material comprises a material selected from the group consisting of $TiO_2$, $ZrO_2$, $Ta_2O_5$, and $Nb_2O_5$.

7. The device of claim 1 wherein the ferroelectric material comprises lead zirconium titanate.

8. The device of claim 1 wherein the ferroelectric material comprises strontium bismuth tantalate.

9. The device of claim 1 wherein the diffusion barrier material comprises titanium oxide.

10. The device of claim 1 wherein the diffusion barrier material comprises zirconium oxide.

11. The device of claim 1 wherein the diffusion barrier material comprises tantalum oxide.

12. The device of claim 1 wherein the diffusion barrier material comprises niobium oxide.

13. The device of claim 1, further comprising an insulative material deposited over the diffusion barrier material, wherein the insulative material comprises silicon nitride.

14. The device of claim 1, further comprising an insulative material deposited over the diffusion barrier material, wherein the insulative material comprises spin-on-glass.

15. The device of claim 1, further comprising an insulative material deposited over the diffusion barrier material, wherein the insulative material comprises silicon fluoride.

16. The device of claim 1, further comprising an insulative material deposited over the diffusion barrier material, wherein the insulative material comprises an organic dielectric material.

17. The device of claim 1, further comprising an insulative material deposited over the diffusion barrier material, wherein the insulative material comprises polyimide.

18. The device of claim 1 wherein the first capacitor plate is formed of a metal selected from the group consisting of aluminum, copper and tungsten.

19. The device of claim 1 wherein the first capacitor plate is formed of a material comprising aluminum.

20. The device of claim 1 wherein the first capacitor plate is formed of a material comprising copper.

21. The device of claim 1 wherein the first capacitor plate is formed of a material comprising tungsten.

22. The device of claim 1, further comprising an insulative material deposited over the diffusion barrier material, wherein the ferroelectric material comprises an oxide material selected from the group consisting of lead zirconium titanate and strontium bismuth tantalate, wherein the oxygen diffusion barrier layer comprises an oxide selected from the group consisting of titanium oxide, zirconium oxide, tantalum oxide and niobium oxide, and wherein the insulative material comprises a material selected from the group consisting of silicon dioxide, silicon nitride, spin-on-glass, silicon fluoride and polyimide.

23. A capacitor, comprising:
a first conductive plate;
a layer of ferroelectric material on the first conductive plate;
a second conductive plate on the layer of ferroelectric material;
a diffusion barrier material over the second conductive plate and a part of the ferroelectric material, wherein the diffusion barrier material has residual internal tensile stress in its structure; and
an insulative material over the diffusion barrier material, wherein the insulative material has residual internal compressive stress in its structure.

24. The capacitor of claim 23 wherein:
the residual tensile stress in the diffusion barrier material and the residual compressive stress in the insulative material cancel one another.

25. An integrated circuit device comprising:
a substrate;
a first capacitor plate formed on the substrate;
a layer of ferroelectric material formed on the first capacitor plate;
a second capacitor plate formed over part of the ferroelectric material;
an oxygen diffusion barrier layer material deposited over the second capacitor plate and an exposed part of the ferroelectric material; and
a layer of insulative material deposited over the diffusion barrier layer;
wherein the oxygen diffusion barrier layer material is graded and/or comprises a material selected from the group consisting of tantalum oxide and niobium oxide.

26. An integrated circuit device comprising:
a substrate;
a first capacitor plate formed on the substrate;
a layer of ferroelectric material formed on the first capacitor plate;
a second capacitor plate formed over part of the ferroelectric material; and
a layered dielectric stack comprising diffusion barrier material layers and insulative material layers in alternating sequence with one another, including at least two diffusion barrier layers and at least two insulative material layers, deposited over the second capacitor plate and an exposed part of the ferroelectric material.

27. An integrated circuit device comprising:
a substrate;
a first capacitor plate formed on the substrate;
a layer of ferroelectric material formed on the first capacitor plate;
a second capacitor plate formed over part of the ferroelectric material;
an oxygen diffusion barrier layer material, comprising a material selected from the group consisting of tantalum oxide and niobium oxide, deposited over the second capacitor plate and an exposed part of the ferroelectric material; and
a layer of insulative material deposited over the diffusion barrier layer.

28. An integrated circuit device comprising a ferroelectric capacitor on a substrate, wherein the capacitor is isolated from material detrimental to electrical characteristics of the capacitor, by an oxygen diffusion barrier layer material selected from tantalum oxide, niobium oxide, and graded materials deposited over the capacitor and directly on the substrate surrounding the capacitor.

* * * * *